United States Patent [19]

Chen

[11] Patent Number: 5,496,409
[45] Date of Patent: Mar. 5, 1996

[54] PARTICLE CONTAMINATION APPARATUS FOR SEMICONDUCTOR WAFER PROCESSING

[75] Inventor: Ping I. Chen, Chung Li, Taiwan

[73] Assignee: United Microelectonics Corporation, Hsin-Chu, Taiwan

[21] Appl. No.: 276,570

[22] Filed: Jul. 18, 1994

[51] Int. Cl.$^6$ .......................... C23C 16/00; C23C 14/00; C23F 1/02
[52] U.S. Cl. .................. 118/715; 156/345; 204/298.01; 204/298.07; 204/298.31; 204/298.33; 204/298.41
[58] Field of Search .................... 118/715; 156/345; 204/298.01, 298.07, 298.31, 298.33, 298.41

[56] References Cited

U.S. PATENT DOCUMENTS

| | | | |
|---|---|---|---|
| 4,340,568 | 7/1982 | Hirai | 118/715 |
| 4,911,597 | 3/1990 | Maydan | 414/217 |
| 5,043,299 | 8/1991 | Chang | 118/715 |
| 5,070,814 | 12/1991 | Whiffin | 118/715 |
| 5,160,543 | 11/1992 | Ishihara | 118/715 |
| 5,223,001 | 6/1993 | Saeki | 29/25.01 |
| 5,292,393 | 3/1994 | Maydan | 156/345 |
| 5,336,029 | 8/1994 | Kato | 414/217 |
| 5,387,289 | 2/1995 | Schmitz | 118/715 |

Primary Examiner—R. Bruce Breneman
Assistant Examiner—Jeffrie R. Lund
Attorney, Agent, or Firm—Meltzer, Lippe, Goldstein et al.

[57] ABSTRACT

A semiconductor wafer processing system is disclosed which reduces particle accumulations in the wafer loading chamber during the pump down and vent cycle. A separate venting tube is provided which is positioned within the roughing tube used for the pump-down cycle. The venting tube is isolated from particulate matter which may be present in the roughing tube so that venting gas flow does not cause re-entry of the residual particulate matter into the loading chamber. The venting tube can be easily and inexpensively installed as a particle reduction kit into existing wafer processing systems.

7 Claims, 4 Drawing Sheets

PARTICLE CONTAMINATION APPARATUS FOR SEMICONDUCTOR WAFER PROCESSING

FIELD OF THE INVENTION

The present invention relates to a semiconductor wafer processing system.

BACKGROUND OF THE INVENTION

FIG. 1 illustrates a conventional semiconductor wafer processing system called the MRC "ECLIPS" system. The conventional system includes a load chamber 10 into which semiconductor wafers 20 are loaded. Next, a pump-down (roughing) cycle occurs, during which the loading chamber is evacuated via a fluid connection including roughing tube 50, open rough valve 60, and a mechanical pump (not shown) connected to rough valve 60. Then, the wafer 20 is transported via the transport system 40 to a high-vacuum chamber 30 for processing. Before loading the next wafer 20 into the load chamber 10, a vent cycle occurs. During the vent cycle, as depicted in FIG. 2, $N_2$ gas is drawn into the load chamber 10 through open vent valve 70 in order to flush out load chamber 10.

During the pump-down cycle, aluminum particles thrown off the wafer 20 tend to be drawn into the roughing tube 50. When rough valve 60 is closed at the end of the pump-down cycle, a residual quantity of aluminum particles remains in the region A of the roughing tube 50. During the venting cycle, the $N_2$ gas flow reintroduces the residual particles in region A of roughing tube 50 into the load chamber 10, which tends to contaminate subsequent wafer processing.

It is an object of this invention to reduce the accumulation of particles in a wafer loading chamber during successive roughing and venting cycles. It is a further object of this invention to reduce particle contamination in the loading chamber in a simple and inexpensive fashion.

SUMMARY OF THE INVENTION

According to one embodiment, a wafer processing apparatus is provided with a wafer loading chamber, a first tube and a second tube. The first tube is connected to the loading chamber, a pump down valve and a vent valve. The second tube is illustratively positioned within the first tube and connects the vent valve with the loading chamber. The second tube is for isolating a fluid flow therein, e.g., the flow of $N_2$ gas from the vent valve to the load chamber, from particulate matter, e.g., residual aluminum particles, which may have accumulated in the first tube.

A simple apparatus is therefore provided which reduces contamination in the wafer processing apparatus at a low cost.

DETAILED DESCRIPTION OF THE INVENTION

Figure 3:
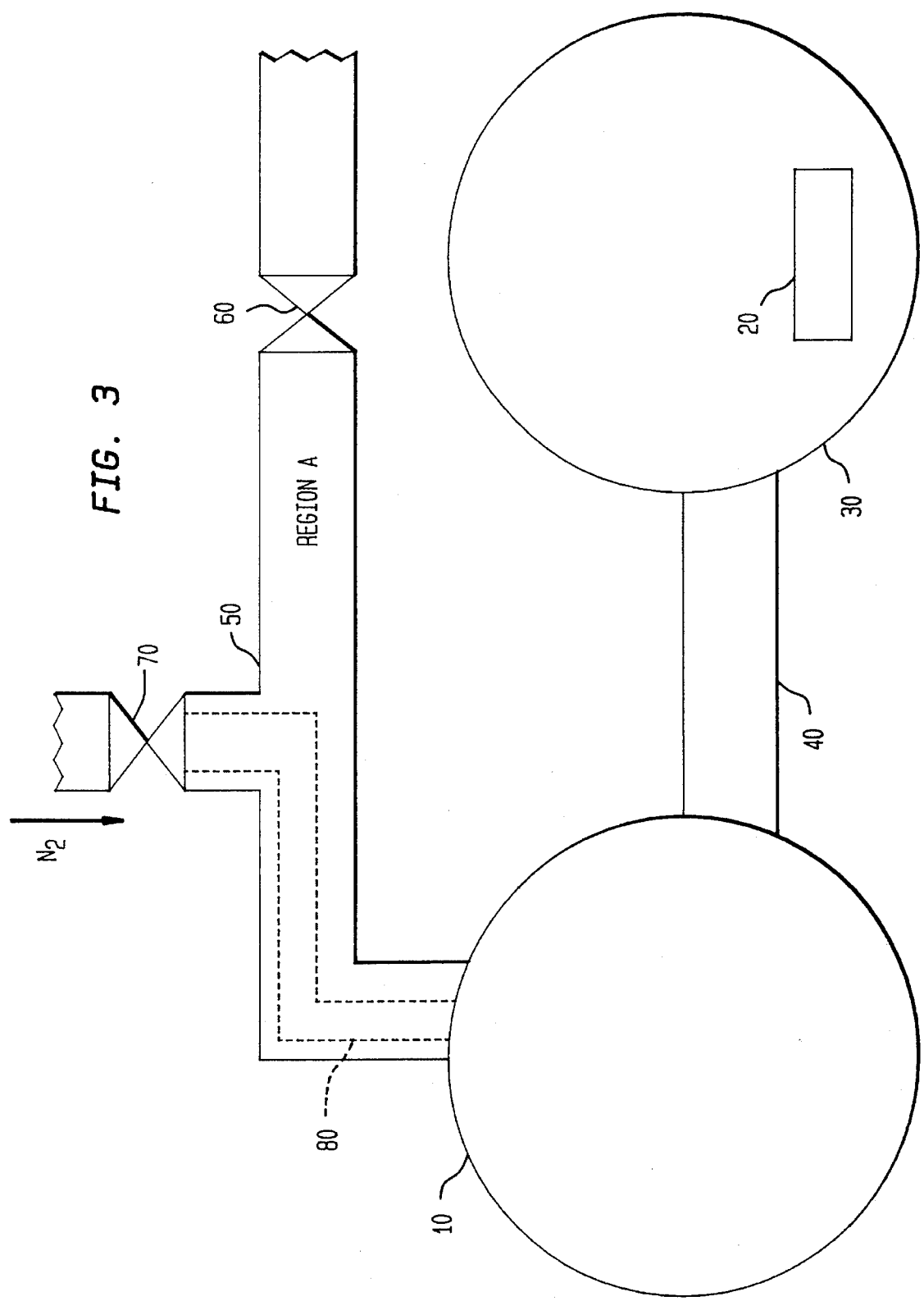
FIG. 3 shows the inventive wafer processing system.

The inventive wafer processing apparatus is shown in FIG. 3. An additional fluid connection is provided including a $N_2$ venting tube 80 positioned within roughing tube 50 and connected directly between the vent valve 70 and single port of the load chamber 10 to which the roughing tube 50 is connected. Thus, the venting action of the $N_2$ gas flow is totally isolated from the particles in the roughing tube 50, in particular, aluminum residual particles in the region A. In other words, the fluid flow through the venting tube 80 no longer causes residual particulate matter in the roughing tube 50 to re-enter load chamber 10 during the vent cycle. As a result, the load chamber 10 is more effectively vented, so that it is adequately cleaned for subsequent wafer processing.

The venting tube 80 may be provided as a separate kit which is easily installed in an existing wafer processing system.

Figure 1:
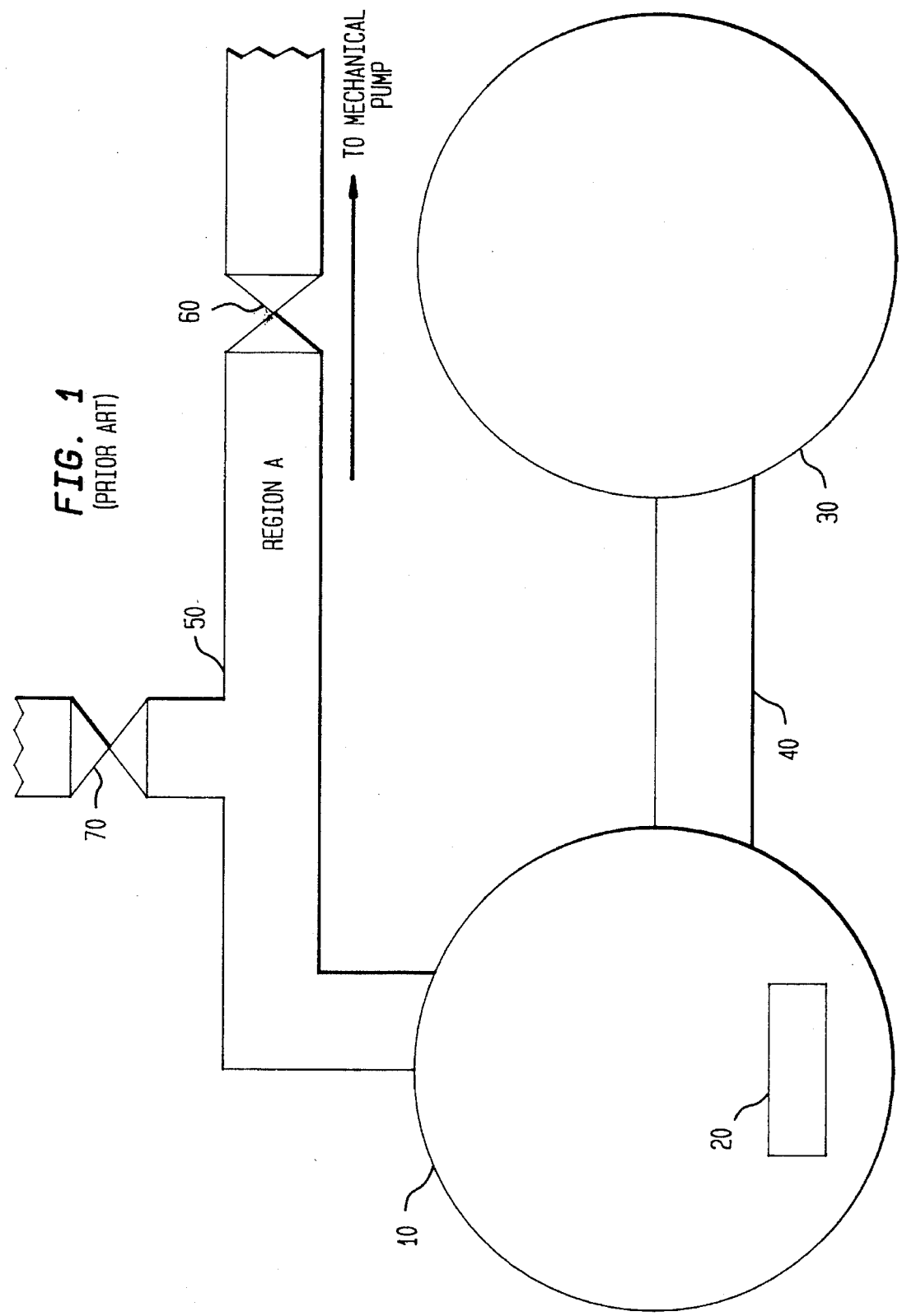
FIG. 1 depicts a conventional wafer processing system during the pump-down cycle.
Figure 2:
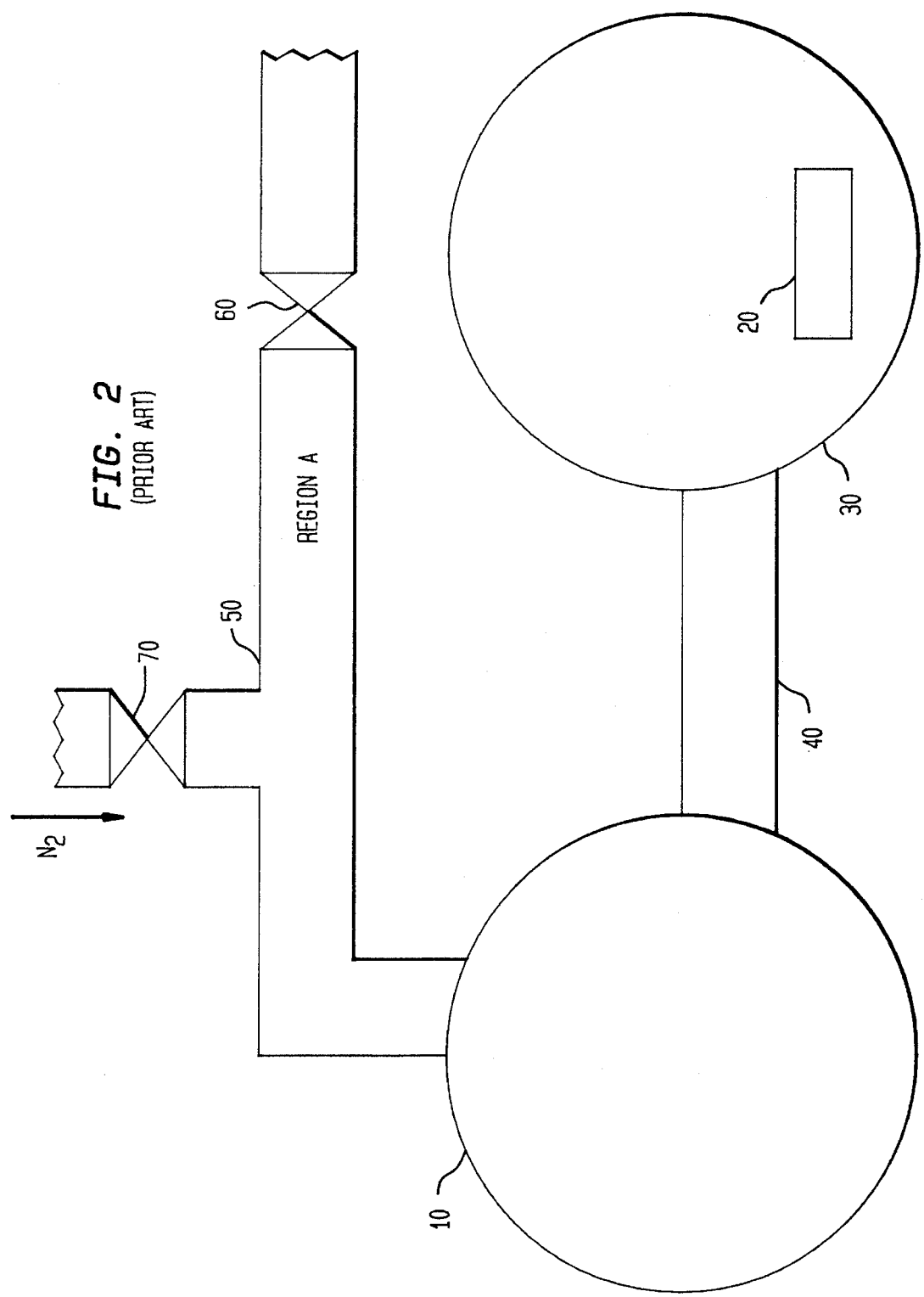
FIG. 2 depicts a conventional wafer processing system during the vent cycle.
Figure 4:
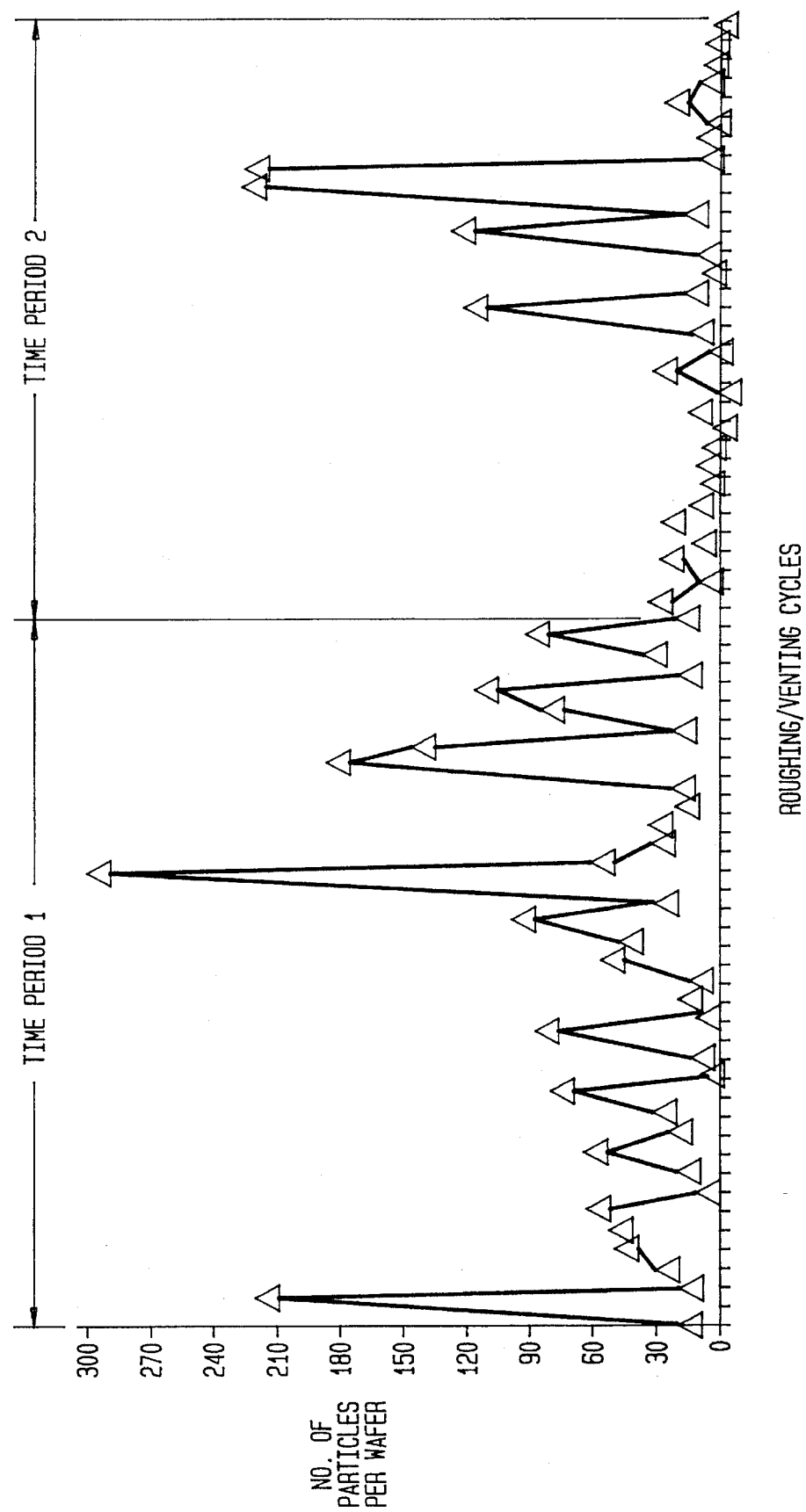
FIG. 4 is a chart which illustrates the reduction in particle accumulation with the inventive system.

The chart in FIG. 4 depicts the particle level trend in a typical load chamber before and after the installation of the inventive device. The vertical axis denotes the quantity of particles on a 6-inch wafer surface, while the horizontal axis represents a series of time periods during which the particles have accumulated as a result of the rough/vent cycles. Time period 1 illustrates the effects of the conventual system of FIGS. 1 and 2, while time period 2 illustrates the effects of the inventive system. FIG. 4 shows a clear reduction in the number of particles accumulating in the load chamber of the present system. For example, during time period 1, 13 data points are seen to be equal to or greater than 60, while in time period 2, only 4 data points exceed the 60 level. Furthermore, the maximum particle count within time period 1 equals 300, while the maximum for time period 2 is approximately 230, and the majority of data points in time period 2 fall well below the majority of data points in time period 1.

Finally, the above described embodiment of the invention is intended to be illustrative only. Numerous alternative embodiments may be devised by those skilled in the art without departing from the spirit and scope of the following claims.

I claim:

1. A semiconductor wafer processing apparatus comprising:

a load chamber for loading one or more semiconductor wafers, a first tube, connected to said load chamber and branching out to a pump down valve, and to a vent valve, and a second tube, positioned within said first tube, such that said second tube connects directly between said vent valve and said load chamber and isolates a fluid flow therein from particulate matter in said first tube.

2. The apparatus of claim 1 further comprising a mechanical pump connected to the opposite side of said pump down valve, with respect to said first tube.

3. The apparatus of claim 1, further comprising a supply of $N_2$ connected to the opposite side of said vent valve, with respect to said second tube.

4. The apparatus of claim 1, further comprising a high-vacuum chamber connected to said load chamber by a wafer transport mechanism.

5. A method of reducing residual particle accumulation in a load chamber during semiconductor processing, comprising the steps of:

placing one or more semiconductor wafers in a load chamber, pumping down said load chamber through a first tube and pump down valve, venting said load chamber through a second tube and vent valve, said second tube being located within said first tube, and being connected directly between said vent valve and said load chamber so that said venting through said second tube is isolated from residual particulate matter in said first tube.

6. A fluid circuit for evacuating and venting a wafer processing apparatus, comprising:

a chamber With a single port, a first fluid connection between said port and a first valve, a second fluid connection between said port and a second valve, and contained within said first fluid connection, said second fluid connection for conveying a fluid flow therein so that it is isolated from particulate matter present in said first fluid connection.

7. The fluid circuit of claim 6, wherein said fluid flow in said second fluid connection avoids introducing said particulate matter from said first fluid connection into said chamber.

* * * * *